US008598709B2

(12) United States Patent
Meyer et al.

(10) Patent No.: US 8,598,709 B2
(45) Date of Patent: Dec. 3, 2013

(54) METHOD AND SYSTEM FOR ROUTING ELECTRICAL CONNECTIONS OF SEMICONDUCTOR CHIPS

(75) Inventors: Thorsten Meyer, Regensburg (DE); Gottfried Beer, Nittendorf (DE); Christian Geissler, Regensburg (DE); Thomas Ort, Veitsbronn (DE); Klaus Pressel, Regensburg (DE); Bernd Waidhas, Pettendorf/Neudorf (DE); Andreas Wolter, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 125 days.

(21) Appl. No.: 12/871,939

(22) Filed: Aug. 31, 2010

(65) Prior Publication Data

US 2012/0049375 A1 Mar. 1, 2012

(51) Int. Cl.
*H01L 23/48* (2006.01)
*H01L 21/768* (2006.01)

(52) U.S. Cl.
USPC .............. 257/773; 257/E23.01; 257/E21.575; 257/778; 257/723; 257/724; 257/728; 257/686; 257/685; 257/777; 257/691; 257/696; 257/698; 257/692

(58) Field of Classification Search
USPC ......... 257/773, 778, 723, 724, 728, 685, 686, 257/777, 691, 692, 693, 696, 698, E21.575, 257/E23.01; 438/618
See application file for complete search history.

(56) References Cited

U.S. PATENT DOCUMENTS

| 7,692,310 | B2 | 4/2010 | Park et al. | |
|---|---|---|---|---|
| 7,808,798 | B2 * | 10/2010 | Cotte et al. | 361/763 |
| 7,834,464 | B2 * | 11/2010 | Meyer et al. | 257/777 |
| 7,952,185 | B2 * | 5/2011 | Theuss et al. | 257/690 |
| 8,178,982 | B2 * | 5/2012 | Ramakrishna et al. | 257/787 |
| 2004/0188818 | A1 * | 9/2004 | Wang | 257/685 |
| 2004/0207077 | A1 * | 10/2004 | Leal et al. | 257/723 |
| 2007/0075437 | A1 | 4/2007 | Nishimura | |
| 2008/0029850 | A1 * | 2/2008 | Hedler et al. | 257/621 |
| 2009/0072411 | A1 | 3/2009 | Tews | |
| 2009/0155956 | A1 * | 6/2009 | Pohl et al. | 438/109 |
| 2009/0261468 | A1 * | 10/2009 | Kroeninger et al. | 257/690 |
| 2010/0019370 | A1 * | 1/2010 | Pressel et al. | 257/690 |
| 2011/0068484 | A1 * | 3/2011 | Meyer et al. | 257/782 |
| 2012/0038063 | A1 * | 2/2012 | Meyer et al. | 257/777 |

* cited by examiner

*Primary Examiner* — A O Williams
(74) *Attorney, Agent, or Firm* — Dicke, Billig & Czaja, PLLC

(57) ABSTRACT

A method and a system for routing electrical connections are disclosed. A semiconductor device includes a first semiconductor chip and a routing plane having a plurality of routing lines. A first connecting line is electrically coupled to the first semiconductor chip and one of the plurality of routing lines and a second connecting line is electrically coupled to the one of the plurality of routing lines and to one of a second semiconductor chip or a first external contact element.

24 Claims, 15 Drawing Sheets

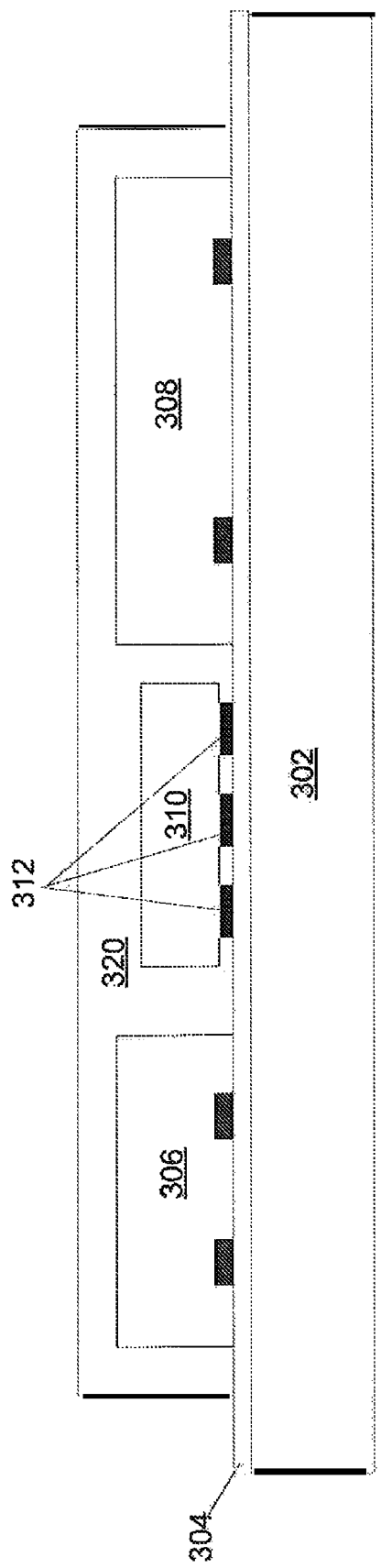

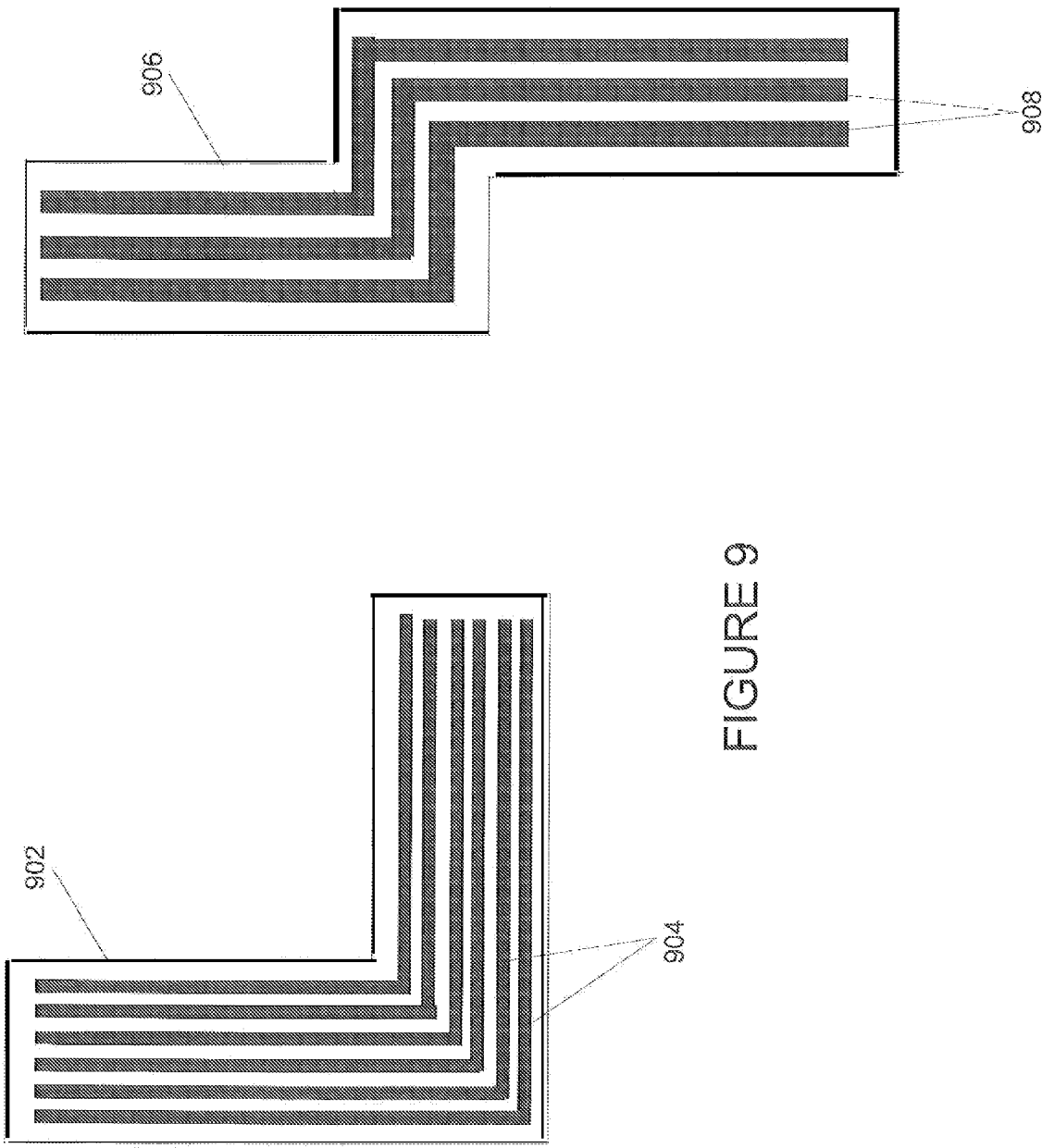

METHOD AND SYSTEM FOR ROUTING ELECTRICAL CONNECTIONS OF SEMICONDUCTOR CHIPS

TECHNICAL FIELD

The present invention relates generally to routing electrical connections of semiconductor chips. In particular, the present disclosure relates to a method and system for an embedded routing plane for routing electrical connections of semiconductor chips.

BACKGROUND

In a semiconductor package, one or more semiconductor chips may be included to provide different functionalities. For example, a semiconductor package may include an application processor chip for a specific application, a sensor chip for collecting data and a power integrated circuit chip to provide a power source for other chips in the package. In these packages, routing electrical connections between the plurality of chips and from external sources may be difficult due to limited space and structure of the package. Therefore, a need exists for a method and system to route electrical connections of semiconductor chips in an efficient manner.

BRIEF DESCRIPTION OF DRAWINGS

FIGS. 3A-3G are diagrams illustrating an exemplary process for forming a semiconductor device for routing electrical connections of semiconductor chips in accordance with an embodiment of the present disclosure.

FIG. 9 is a diagram illustrating various embedded routing planes in accordance with alternative embodiments of the present disclosure.

SUMMARY OF INVENTION

Figure 1:
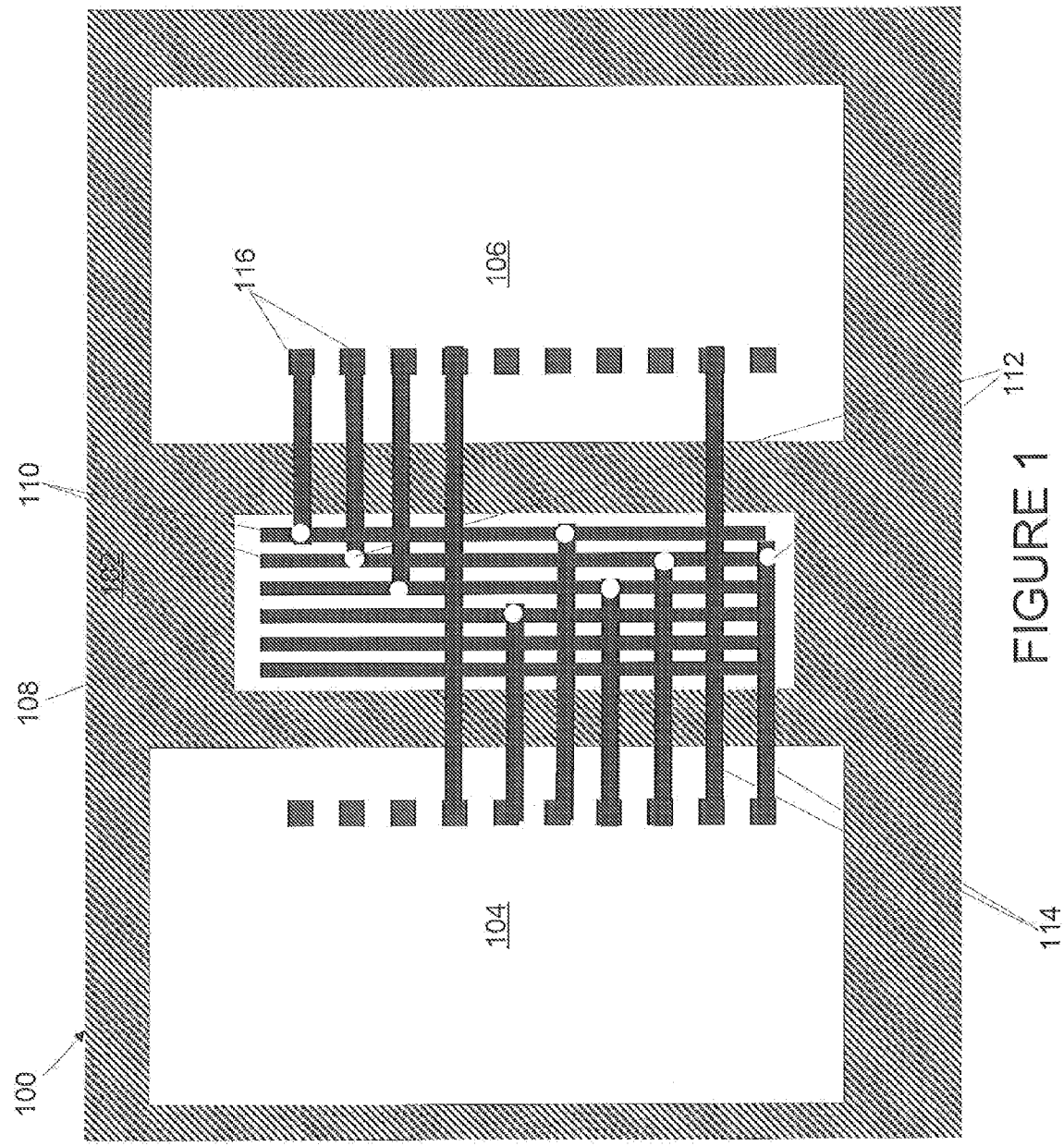
FIG. 1 illustrates a system of routing electrical connections of semiconductor chips in accordance with one embodiment of the present disclosure.

The present disclosure provides a method and system for routing electrical connections of a plurality of semiconductor chips. In one embodiment, a semiconductor device is provided comprising at least one semiconductor chip, at least one routing plane comprising at least one routing line, and at least one connecting line electrically coupled to the at least one routing line and at least one semiconductor chip.

Alternatively, a semiconductor device is provided comprising at least one semiconductor chip having at least one contact element, at least one routing plane having at least one routing line, a first insulating layer disposed the at least one semiconductor chip and the at least one routing plane and structured over the at least one contact element, and a redistribution layer disposed over the first insulating layer to form at least one connecting line.

In yet another embodiment, a method for routing electrical connections of a plurality of chips are provided comprising providing at least one semiconductor chip and at least one routing plane, applying an insulating layer over the at least one semiconductor chip and the at least one routing plane, forming a plurality of via openings in the insulating layer, and forming a redistribution layer over the insulating layer to provide at least one connecting line.

DETAIL DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types, may be manufactured by different technologies and may include for example, integrated electrical or electro-optical circuits or passives or MEMS etc. Semiconductor chips may be configured, for example, as power transistors, power diodes, IGBTs (Isolated Gate Bipolar Transistors). Semiconductor chips may have a vertical structure and may be fabricated in such a way that electrical currents can flow in a direction perpendicular to the main surfaces of the semiconductor chips. These semiconductor chips may have contact elements disposed on its main surfaces, which includes a top surface and a bottom surface. Examples of semiconductor chips having a vertical structure include power transistors and power diodes. In case of power transistors, the source electrode and the gate electrode may be disposed on a first main surface while the drain electrode may be disposed on a second main surface. In case of a power diode, the anode electrode may be disposed on a first main surface while the cathode electrode may be disposed on a second main surface.

The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives. The semiconductor chips may also include antennas and/or discrete passives. Semiconductor chips, in which such functional elements are embedded, generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have contact elements which allow electrical contact to be made with the semiconductor chips. The contact elements may be composed of any desired electrically conductive material, for example, of a metal, such as aluminum, nickel, palladium, gold or copper, a metal alloy, a metal stack or an electrically conductive organic material. The contact elements may be situated on the active main surfaces of the semiconductor chips or on other surfaces of the semiconductor chips. The active or passive structures of the semiconductor chips are usually arranged below the active main surfaces and can be electrically contacted via the contact elements. In case of power transistors, the contact elements may be drain, source or date electrodes.

The devices described in the following may include external contact elements that are accessible from outside of the devices to allow electrical contact to be made from outside of the devices. In addition, the external contact elements may be thermally conductive and serve as heat sinks for heat dissipation of the semiconductor chips. The external contact elements may be composed of any electrically conductive material, for example, a metal such as copper, Pd, Ni, Au, etc.

The devices described in the following may include an encapsulating material covering at least parts of the semiconductor chips. The encapsulating material is an electrically insulating material, which is at most marginally electrically conductive relative to the electrically conductive components of the device. Examples of an encapsulating material include a mold material and an epoxy based material. The encapsulating material may be any appropriate duroplastic, thermoplastic, laminate (prepreg) or thermosetting material and may contain filler materials. Various techniques may be employed to cover the semiconductor chips with the mold material, for example, compression molding, lamination or injection molding.

In a semiconductor package, multiple semiconductor chips may be used to provide different functionalities. Currently, a multi-layer structure is provided in the package if more than one redistribution layer is required to route electrical connections between the plurality of chips or between a semiconductor chip and external connections. This multi-layer structure is costly to implement since it is required at various areas of the package.

The present disclosure provides a method and a system to route electrical connections of semiconductor chips within a package or with external connections. In one embodiment, an embedded routing plane is provided in an area which has a high density of electrical connections between the plurality of chips. In another embodiment, an embedded routing plane is provided in an area which has a high density of electrical connections between at least one semiconductor chip and an external component outside of the semiconductor package. In one example, the embedded routing plane may be used in a high interconnect density area within a redistribution layer between multiple chips. In another example, the embedded routing plane may be used in areas where there is a high routing density in general. Thus, the embedded routing plane may be used within the redistribution layer or other layers that has a high routing density. In the context of the present disclosure, a redistribution layer is a layer composed of conductive material that is electrically coupled to contact elements of the chips and other conductive elements.

FIG. 1 illustrates a system of routing electrical connections of a plurality of chips in accordance with one embodiment of the present disclosure. In this embodiment, semiconductor package 100 comprises a plurality of semiconductor chips, for example, semiconductor chips 104 and 106. Semiconductor chips 104 and 106 may perform similar or different functions. For example, semiconductor chip 104 may be an application processor providing application function while semiconductor chip 106 may be a power semiconductor chip providing a power source to semiconductor chip 104.

Semiconductor package 100 also comprises an embedded routing plane 108. In one embodiment, embedded routing plane 108 is disposed between semiconductor chips 104 and 106. The embedded routing plane 108 may be disposed using embedding material, such as a mold material or laminate. However, other methods for disposing the embedded routing plane 108 may be used without departing the spirit and scope of the present disclosure. In addition, the embedded routing plane 108 may be disposed at any location within the package 100 having a high interconnect density, for example, between other chips within package 100 or between any semiconductor chip and external connections.

The embedded routing plane 108 may be a silicon carrier with a high routing line density. The embedded routing plane 108 may also compose of any polymer or ceramic substrate, for example, a multi-layer HTCC or LTCC. Additional passive or active devices, multi-layer redistribution lines, fuses or landing pads for the application of interconnect elements, preferable solder balls may be integrated into the embedded routing plane 108. Furthermore, the embedded routing plane 108 may compose of any metal, metal alloy or metal stack of different metals, in which case the embedded routing plane 108 may serve as a ground or power plane.

The embedded routing plane 108 comprises at least one routing line 110. The at least one routing line 110 may compose of any metal, any alloy or any metal stack of different metals for electrical connections. In addition, more than one metal layer may be used to form the at least one routing line 110. The at least one routing line 110 faces an active side of the semiconductor chips 104 and 106 to provide interconnections between the semiconductor chips.

A plurality of via openings 112 may be formed over each of the at least one routing line 110 through which the embedded routing plane 108 is connected to the semiconductor chips 104 and 106. In one embodiment, one of the plurality of via openings 112 may be formed at a first end of the routing line 110 while another one of the plurality of via openings 112 may be formed at a second end of the same routing line 110. However, the plurality of via openings 112 may be formed at any location along the at least one routing line without departing the spirit and scope of the present disclosure.

The at least one routing line 110 is electrically coupled to at least one connecting line 114 through the plurality of via openings 112. Each of the at least one connecting line 114 is electrically coupled to an electrode or contact element of the semiconductor chips 104 or 106. The at least one connecting line 114 may be oriented at any angle in relation to the at least one routing line 110. In this example, the at least one connecting line 114 are arranged perpendicularly to the at least one routing line 110. However, the at least one connecting line 114 may be arranged at other angle in relation to the at least routing line 110 depending on the location of the embedded routing plane 108. The at least one connecting line 114 may compose of any metal for electrical connections and may be formed over one or more metal layers.

It is noted that both the at least one routing line 110 and the at least one connecting line 114 may have different line thickness or width. For example, the size of the at least one connecting line 114 may be the same, larger than, or smaller than the size of the contact element 116 of semiconductor chips 104 and 106. With an embedding routing plane having the at least one routing line being electrically coupled to the at least one connecting line, the routing density between the semiconductor chips or with external connections may be reduced as the embedded routing plane may be placed at any location having high routing density. Consequently, the cost is reduced because less redistribution layers are required to route electrical connections between the plurality of chips.

Figure 2:
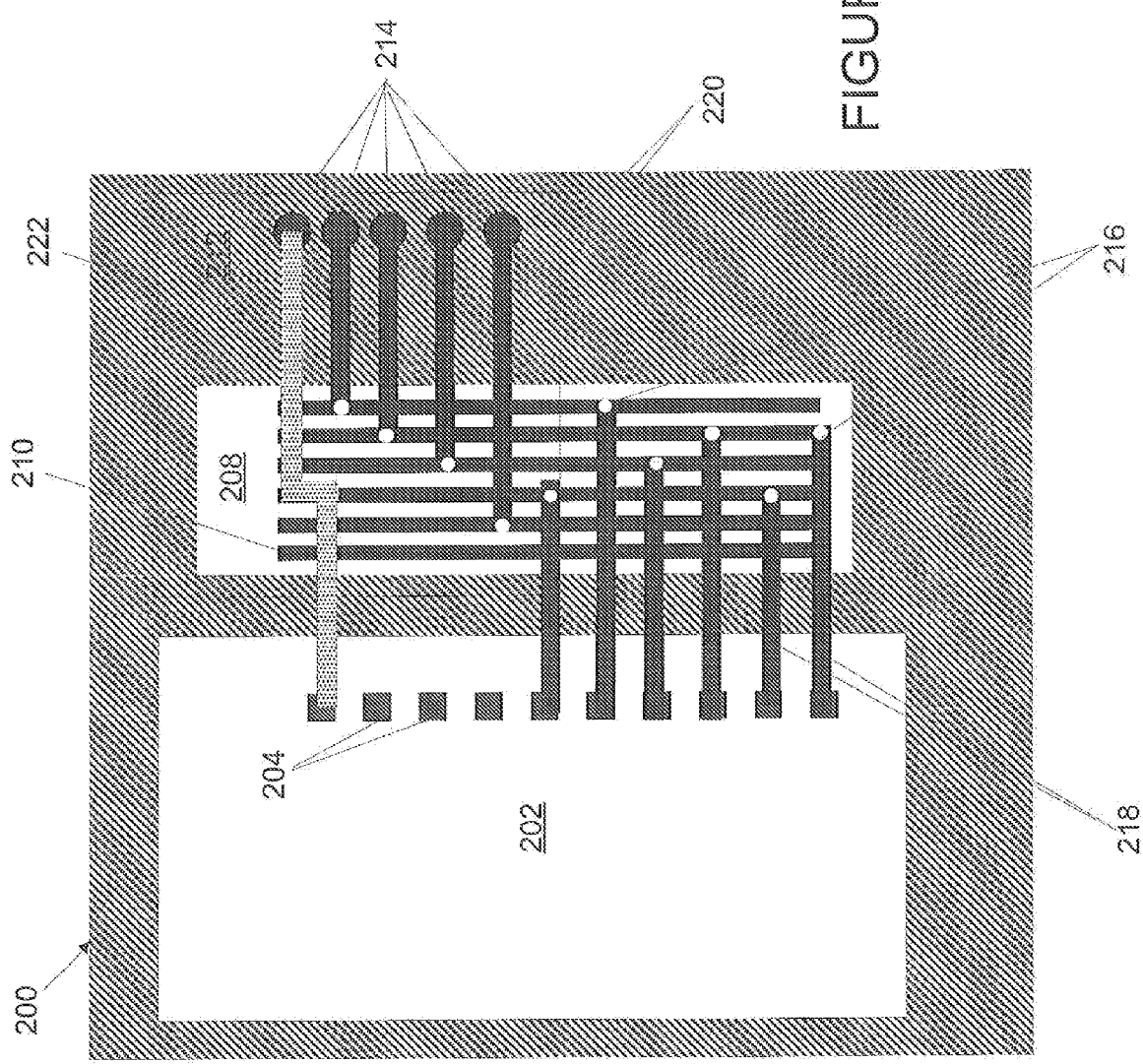
FIG. 2 illustrates a system of routing electrical connections of semiconductor chips in accordance with an alternative embodiment of the present disclosure.

Referring to FIG. 2, a diagram illustrating a system of routing electrical connections of semiconductor chips is depicted in accordance with an alternative embodiment of the present disclosure. Instead of a plurality of semiconductor chips, semiconductor package 200 in FIG. 2 comprises a semiconductor chip, for example, semiconductor chip 202 having a plurality of contact elements 204. In addition, semiconductor package 200 comprises an embedded routing plan 208.

The embedded routing plane 208 may be a silicon carrier or other types of carrier composed of any polymer or ceramic substrate, for example, a multi-layer HTCC or LTCC. Additional passive or active devices, multi-layer redistribution lines, fuses or landing pads for the application of interconnect elements, preferable solder balls may be integrated into the embedded routing plane 208. Furthermore, the embedded routing plane 208 may compose of any metal, metal alloy or metal stack of different metals, in which case the embedded routing plane 208 may serve as a ground or power plane.

In this embodiment, the embedded routing plane 208 is disposed in an area of package 200 with high routing line density, for example, area 212 that comprises connections to a plurality of contact elements 214 for communication with external components outside of the package 200. The embedded routing plane 208 comprises at least one routing line 210. The at least one routing line 210 may compose of any metal, any alloy or any metal stack of different metals for electrical connections. In addition, more than one metal layer may be used to form the at least one routing line 210. The at least one routing line 210 faces an active side of the semiconductor chip 202 to provide connection between semiconductor chip 202 and the plurality of contact elements 214 to external component outside of package 200.

A plurality of via openings 216 may be formed over the at least one routing line 210 through which the embedded routing plane 208 is connected to the semiconductor chip 202. In one embodiment, one of the plurality of via openings 216 may be formed at a first end of the routing line 210 while another one of the plurality of via openings 216 may be formed at a second end of the same routing line 210. However, the plurality of via openings 216 may be formed at any location along the at least one routing line 210 without departing the spirit and scope of the present disclosure.

The at least one routing line 210 is electrically coupled to at least one connecting line 218, 220 through the plurality of via openings 216. A first connecting line 218 is electrically coupled to a contact element of the semiconductor chip 202. A second connecting line 220 is electrically coupled to the contact element 214.

The first 218 and second 220 connecting line may be oriented at any angle in relation to the at least one routing line 210. In this example, the first 218 and second 220 connecting line are arranged perpendicularly to the at least one routing line 210. However, the at least one connecting line 218, 220 may be arranged at other angle in relation to the at least routing line 210 depending on the location and orientation of the embedded routing plane 208. The at least one connecting line 218, 220 may compose of any metal for electrical connections and may be formed over one or more metal layers.

It is noted that both the at least one routing line 210 and the first 218 and second 220 connecting line may have different line thickness or width. For example, the size of first 218 and second 220 connecting line may be the same, larger than, or smaller than the size of the contact elements 204 of semiconductor chip 202 and contact elements 214 to external component outside of package 200. With an embedding routing plane 208 having the at least one routing line 210 being electrically coupled to the first 218 and second 220 connecting line, the routing density between the semiconductor chip 202 and external component through contact elements 214 may be reduced as the embedded routing plane 208 may be placed at any location in the package 200 having high routing density. Consequently, the cost is reduced because less redistribution layers are required to route electrical connections between the package 200 and the external components outside of package 200.

It is also noted that more than one semiconductor chip 202 may be included in semiconductor package 200 and more than one external component outside of package 200 may be connected to the one or more semiconductor chip 202 in package 200 for communication through the embedded routing plane 208. In that case, additional connecting line similar to the first 218 and second 220 connecting line may be provided and electrically coupled to the embedded routing plane 208.

Also with the use of embedded routing plane 208, additional crossings between the semiconductor chip 202 and other semiconductor chip in the package or external component outside of package may be realized. For example, at least one crossing line 222 may be provided and electrically coupled between the semiconductor chip 202 and a plurality of contact elements 214. In that case, the at least one crossing line 222 may be formed above, below, or around the embedded routing plane 208 in a redistribution layer different from the redistribution layer in which the at least one routing line 210 is formed.

Figure 3A:
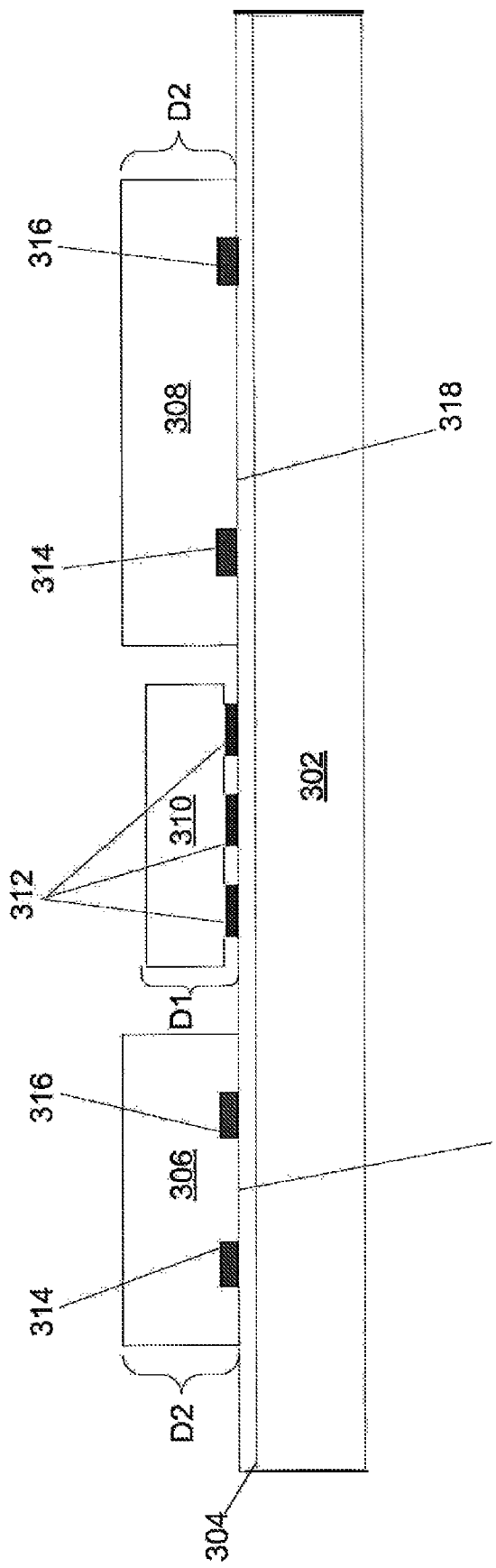

Referring to FIGS. 3A-3G, diagrams illustrating an exemplary process for forming a semiconductor device for routing electrical connections of semiconductor chips are depicted in accordance with one embodiment of the present disclosure. In FIG. 3A, a process for forming a semiconductor package, such as semiconductor package 100, is shown. A carrier 302 is provided and a layer of adhesive 304 is disposed over the carrier 302. The carrier 302 may be a metal carrier or other types of carrier. The adhesive layer 304 may be made of any adhesive material including, but not limited to adhesive tape.

A plurality of semiconductor chips, for example, semiconductor chips 306 and 308, and at least one embedded routing plane 310 are picked and placed onto the carrier 302 over the adhesive layer 304. In one embodiment, the at least one embedded routing plane 310 may be prefabricated with at least one routing line 312 and may be picked and placed onto carrier 302 in a manner similar to semiconductor chips 306 and 308. The semiconductor chips 306 and 308 and at least one embedded routing plane 310 are attached to the carrier 302 by the adhesive layer 304 once they are placed on the surface.

The at least one embedded routing plane 310 may be made of various materials, for example, silicon, glass, ceramic, multilayer ceramic, polymer, etc. In addition, the embedded routing plane 310 may be made of any metal, metal alloy or metal stack of different metals, in which case the embedded routing plane may serve as a ground or power plane. Furthermore, the at least one embedded routing plane 310 may have additional integrated devices, such as passive or active devices, antennas, etc. The at least one embedded routing plane may also have a multi-layer redistribution having multiple redistribution layers with one redistribution layer being disposed over another in a direction perpendicular to the carrier 302.

Alternatively, the at least one embedded routing plane 310 may comprise landing areas (not shown) for external connection elements, like solder balls. More than one embedded routing plane 310 per package may be picked and placed onto the carrier 302 at a time. The shape of the embedded routing plane 310 is not limited to any geometric shape and the size of the embedded routing plane 310 may be of any size depending on the number of electrical connections to be routed.

In this embodiment, the thickness D1 of the embedded routing plane 310 may be the same as the thickness D2 of semiconductor chips 306 and 308. However, thickness D1 of the embedded routing plane 310 may be more or less than the thickness D2 of semiconductor chips 306 and 308 without departing the spirit and scope of the present disclosure. In this example, the at least one routing line 312 is disposed outside the body of the embedded routing plane 302 on the same side as and facing the active surface 318 of semiconductor chips 306 and 308. Thus, thickness D1 includes the thickness of the body of the embedded routing plane 210 itself and the at least one routing line 312.

However, the at least one routing line 312 may be disposed within the body of the embedded routing plane 302 also on the same side as the active surface 318 of semiconductor chips 306 and 308 without departing the spirit and scope of the present disclosure. In that case, thickness D1 only includes the thickness of the body of the embedded routing plane 310 as the at least one routing line 312 is already embedded within the body of the embedded routing plane 310.

Semiconductor chips 306 and 308 may be fabricated on a wafer made of a semiconductor material. Semiconductor chips 306 and 308 may be manufactured on the same wafer or different wafers. Semiconductor chips 306 and 308 may be identical chips or chips with different integrated circuits. In addition, semiconductor chips 306 and 308 may have same, similar, or different functionalities. Semiconductor chips 306 and 308 may comprise contact elements, such as contact elements 314 and contact elements 216, that are disposed on an active or first surface 318 of the semiconductor chips 306 and 308.

Referring to FIG. 3B, after at least one semiconductor chip 306, 308 are placed onto carrier 302, an encapsulating material, such as a mold material, is applied over the at least one semiconductor chip 306, 308 and the embedded routing plane 310 to form a molding 320. In one embodiment, the mold material may be based on epoxy material and may contain a filler material consisting small particles or fibers of glass ($SiO_2$) or other electrically insulating material filler material such as $Al_2O_3$ or organic filler materials. In one embodiment, the encapsulating material may be applied using compression molding. However, other methods of applying encapsulating material, e. g. lamination, pouring or printing may be used without departing the spirit and scope of the present disclosure.

Figure 3C:
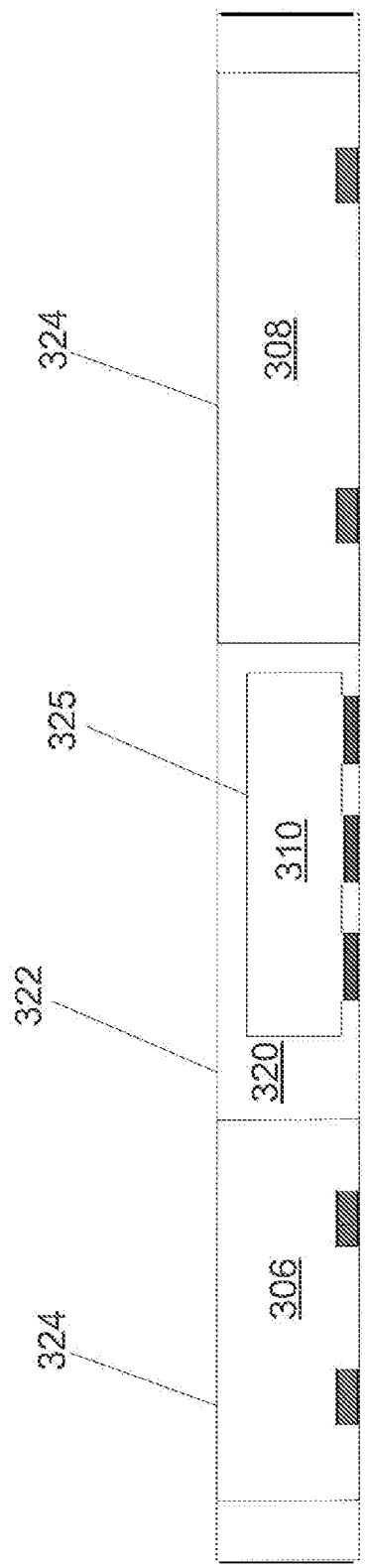

After the molding 320 is formed, referring to FIG. 3C, the carrier 302 is removed. In one embodiment, the carrier 302 may be removed using a vacuum chuck. After the carrier 302 is removed, the at least one semiconductor chip 306, 308, the embedded routing plane 310, and/or the molding 320 may be thinned or grinded to a desired thickness. In one embodiment, wafer grinding machines may be used to grind or thin the at least one semiconductor chip 306, 308, the embedded routing plane 310, and/or the molding 320. Alternatively, a chemical mechanical polishing process may be used to carry out the grinding or thinning. The at least one semiconductor chip 306, 308, the embedded routing plane 310, and/or the molding 320 may be grinded or thinned simultaneously or in any order.

After grinding, the top surface 322 of the mold material 320 and the second surface 324 of the at least one semiconductor chip 306, 308 are substantially coplanar. However, the grinding or thinning of at least one semiconductor chip 306, 308, the embedded routing plane 310, and/or the molding 320 is optional depending on the application. If the thickness D1 of the embedded routing plane 310 is same or similar to the thickness D2 of the at least one semiconductor chip, the top surface 322 of the mold material 320, the second surface 324 of the at least one semiconductor chip 306, 308, and top surface 325 of the embedded routing plane 310 are substantially coplanar.

Figure 3D:
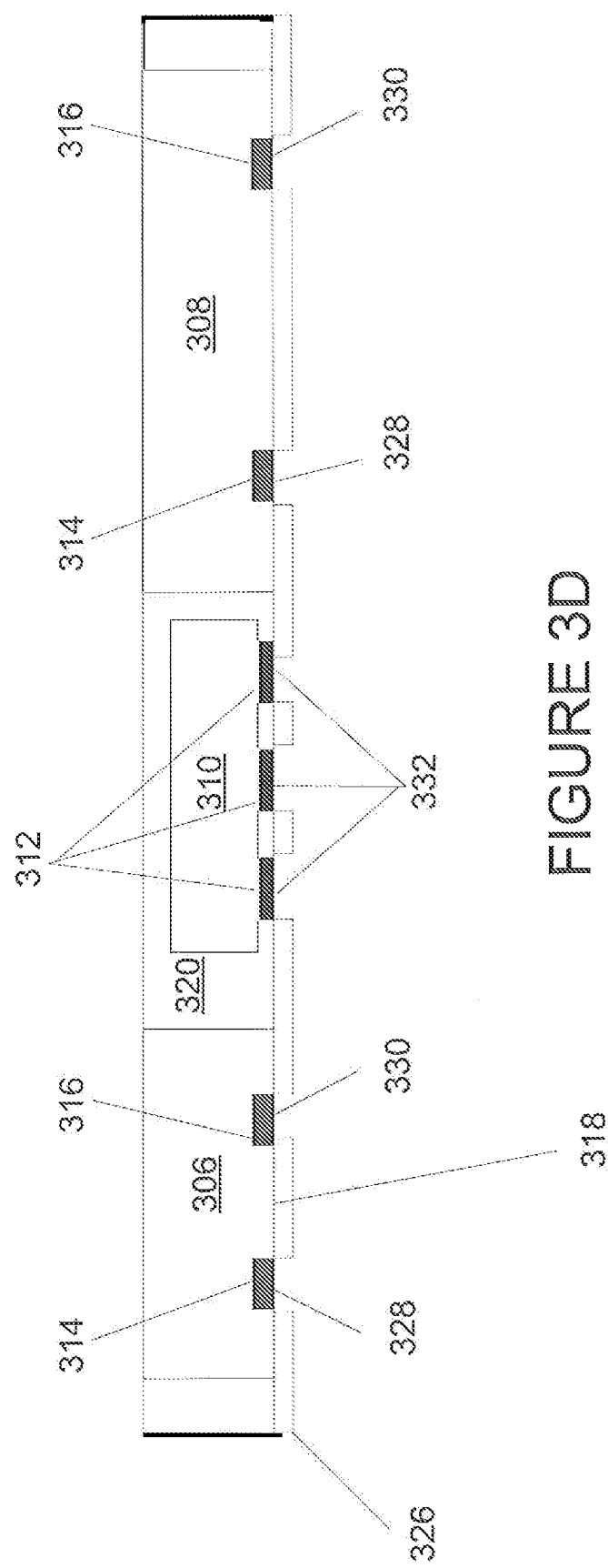

Referring to FIG. 3D, an insulating layer 326 may be applied over the first surface 318 of the at least one semiconductor chip 306, 308, at least one routing line 312 of the at least one embedded routing plane 310, and the molding 320. The insulating layer 326 may be made of a dielectric material. However, other types of insulating material may be used to form insulating layer 326 without departing the spirit and scope of the present disclosure.

A plurality of via openings, such as via openings 328, 330, 332, are then formed in the insulating layer 326. In one embodiment, a plurality of via openings 328 are formed to provide through connections to contact elements 314 of at least one semiconductor chip 306, 308. A plurality of via openings 330 are formed to provide through connections to contact elements, of semiconductor chips 306, 308.

In addition, a plurality of via openings 332 are formed to provide through connections to the at least one routing line 312 of the at least one embedded routing plane 310. The plurality of via openings 328, 330, 332 may be formed by photo-lithography step, drilling using a laser beam, an etching method, or any other method without departing the spirit and scope of the present disclosure. An alternative illustration of the formation of the plurality of via openings is discussed with reference to FIG. 4 below.

Figure 3E:
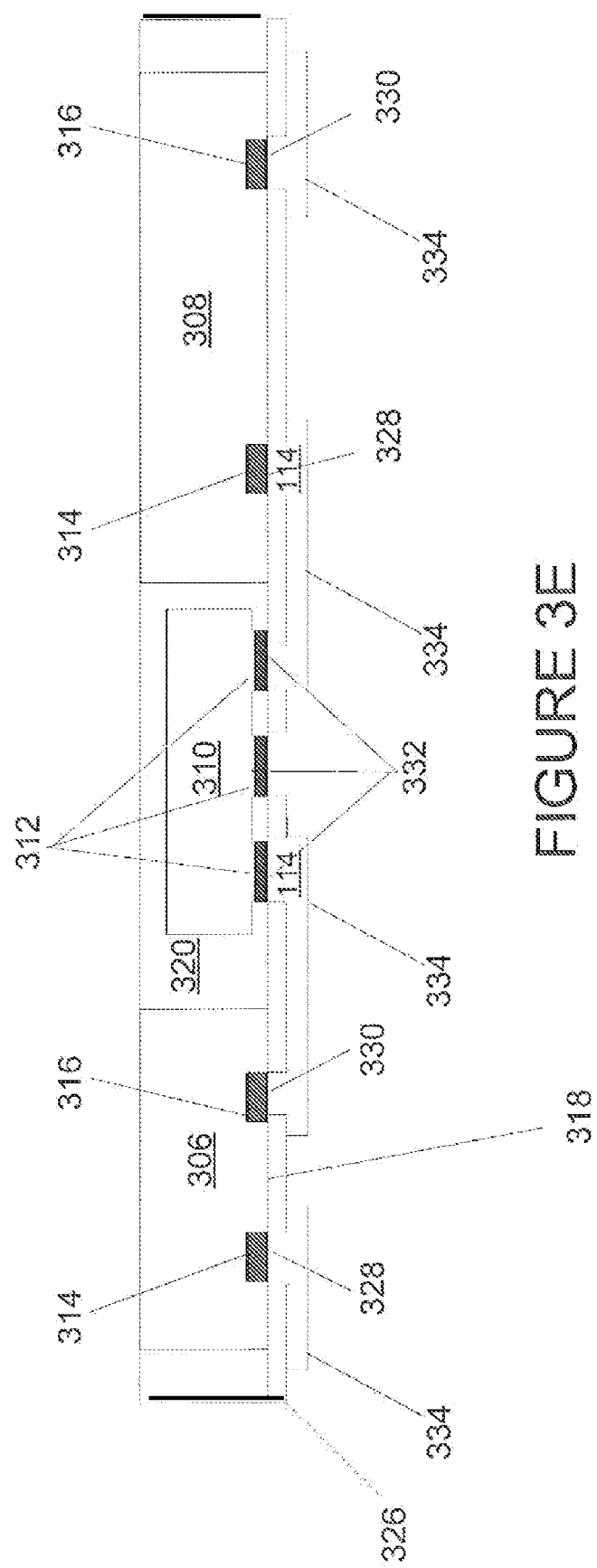

Referring to FIG. 3E, a redistribution layer 334 is formed over the insulating layer 326 to provide at least one connecting line 114. In one embodiment, the at least one connecting line 114 is formed in the redistribution layer 334 and is electrically coupled to the contact elements 314 and 316 of at least one semiconductor chip 306, 308, and the at least one routing line 312 of the at least one embedded routing plane 310. With the at least one connecting line 114, electrical connections between at least one semiconductor chip 306, 308 may be established with the at least one embedding routing plane 310 without additional redistribution layers.

To form a redistribution layer, a barrier layer may first be deposited (e. g. sputtered) over the plurality of via openings, in this example, via openings 328, 330, 332 and the insulating layer 326. The barrier layer may be composed of an electrically conductive material, such as chrome or titanium or an alloy of different metals like titanium and tungsten. Then, a seed layer may be deposited (e. g. sputtered) onto the barrier layer. The seed layer may be composed of an electrically conductive material, such as copper.

After a barrier and/or seed layer is applied, another layer of electrically conductive material, such as copper, or multiple layers of similar or different electrically conductive materials, such as copper, nickel, gold or palladium is galvanically deposited. The electrically conductive material may be copper or any other conductive metal, and may consist of a layer stack of different metals, such as Copper, Nickel and Gold or copper, nickel and copper or copper, nickel and palladium.

Before the electrically conductive material is applied, a plating resist is placed over the barrier and/or seed layer. The plating resist may be placed over the entire barrier and/or seed layer except the plurality of via openings, such as via openings 328, 330, 332, the wafer edge (edge exclusion) and the areas of the redistribution layer intended for the at least one connecting line 114. Typically, the plating resist is exposed and developed after application with photolithography mask (Mask Aligner) or a reticle (Stepper). Another possibility would be to structure the resist by laser (e. g. laser direct imaging) or apply the redistribution layer already structured (e. g. printing). Dual damascene redistribution is possible as well.

After electrically conductive material is applied into areas not covered by the plating resist, the plating resist is stripped and the barrier and/or seed layer are removed chemically, for example, by wet etching. The plating resist may be removed easily with common resist stripping technique. The barrier and/or seed layer may be removed by wet etching. However, portions of the barrier and/or seed layer may be removed using other methods without departing the spirit and scope of the present disclosure.

After the plating resist and the barrier and/or seed layer is removed, at least one connecting line 114 is formed in the redistribution layer 334 to provide electrical connections between semiconductor chips 306, 308 and the at least one routing line 312 of the embedded routing plane 310 through the plurality of via openings 328, 330, 332.

An alternative illustration of the formation of the at least one connecting line is discussed with reference to FIG. 5 below.

Figure 3F:
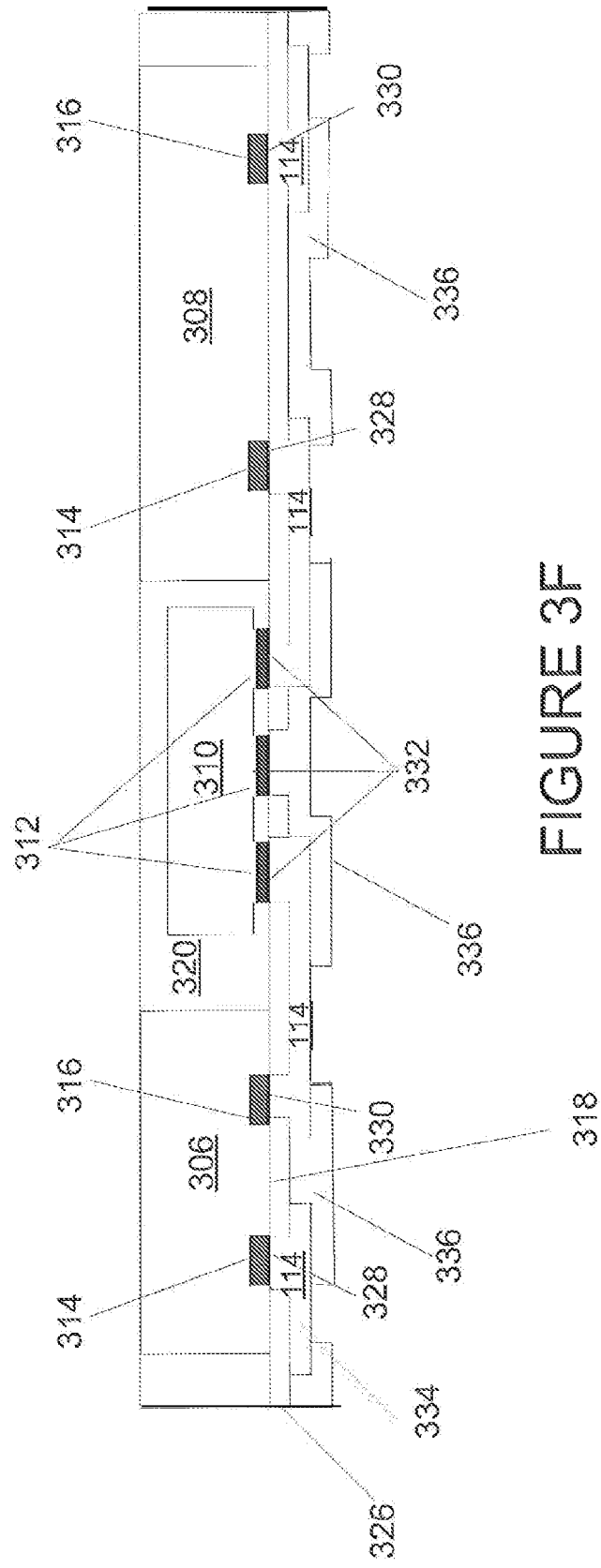

Referring to FIG. 3F, after at least one connecting line 114 is formed in redistribution layer 324, an insulating or solder stop layer 336 is formed over and around the redistribution layer 334. The insulating or solder stop layer 336 is structured to provide landing pads for external connections. The landing pads may be made of any electrically conductive material. Similar to the insulating layer 326, the insulating or solder stop layer 336 may be formed using a dielectric material. However, other insulating material may be used to form the insulating layer 336 without departing the spirit and scope of the present disclosure.

Figure 3G:
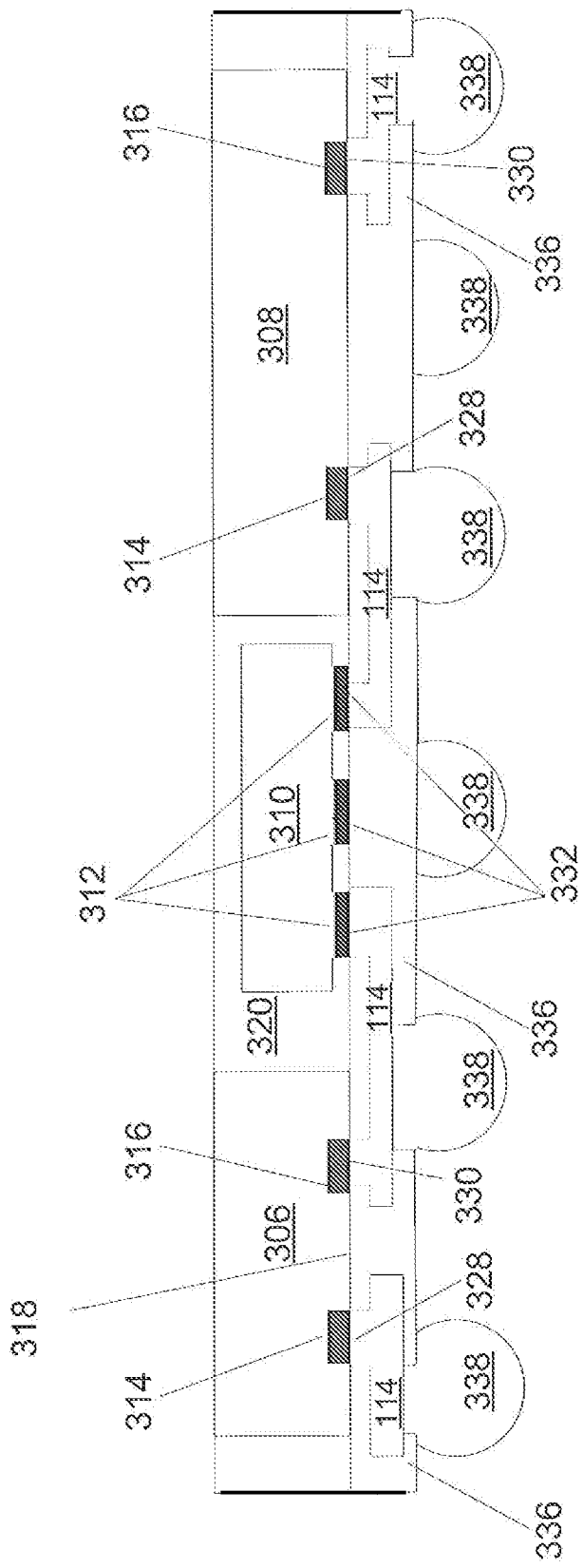

Referring to FIG. 3G, at least one conductive element 338, such as solder elements, may be applied on the landing pads as structured in FIG. 3F to provide external electrical connections to contact elements 314, 316 of the semiconductor chips 306, 308 through the plurality of via openings 328 and 330.

In this example, electrical connection between the contact element 316 of semiconductor chips 306 and contact element 314 of semiconductor chip 308 is provided through the at least one connecting line 114 to the at least routing line 312 of the embedded routing plane 310 via the plurality of via openings 332. In this way, electrical connections of semiconductor chips 306, 308 may be routed without additional redistribution layer.

Figure 4:
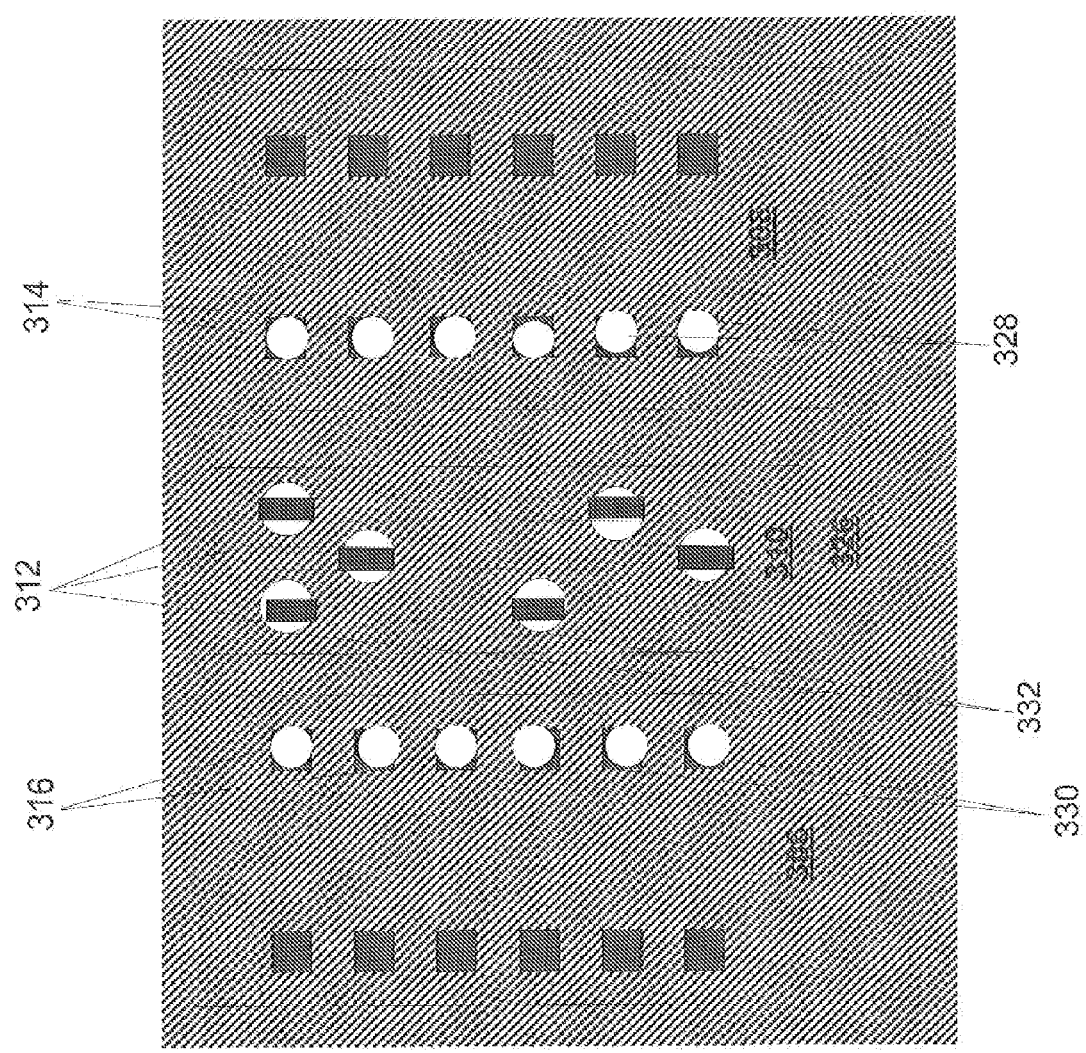
FIG. 4 is an illustration of the formation of a plurality of via openings in accordance with one embodiment of the present disclosure.

Referring to FIG. 4, an alternative illustration of the formation of the plurality of via openings is depicted in accordance with one embodiment of the present disclosure. In this embodiment, a semiconductor package, such as semiconductor package 100, is shown. As discussed above in FIG. 3D, an insulating layer 326 may be applied over the first surface 318 of the semiconductor chips 306, 308 and at least one routing line 312 of the at least one embedded routing plane 310.

A plurality of via openings 328, 330, 332 may then be formed in the insulating layer 326. In this example, a plurality of via openings 328 are formed to provide through connections to contact elements 314 of semiconductor chip 308 and a plurality of via openings 330 are formed to provide through connections to contact elements 316 of semiconductor chip 306. In addition, a plurality of via openings 332 are formed to provide through connections to the at least one routing line 312 of the at least one embedded routing plane 310.

As shown in FIG. 4, a plurality of via openings 332 are formed over the at least one routing line 312 of the embedded routing plane 310, which expose portions of the at least one routing line 312 to be later connected by the at least one connecting line 114 (not shown) to contact elements, such as the contact elements 314 and/or contact elements 316 of semiconductor chips 306 and 308, which are respectively exposed by via openings 328 and 330. It is noted that any number of via openings may be formed in the insulating layer 326 to provide through connections to contact elements of semiconductor chips. For example, more than two via openings may be formed to expose more than two portions of the at least one routing line 312 to be later connected by more than two connecting lines 114 (not shown) to contact elements of the semiconductor chips 306 and 308.

Figure 5:
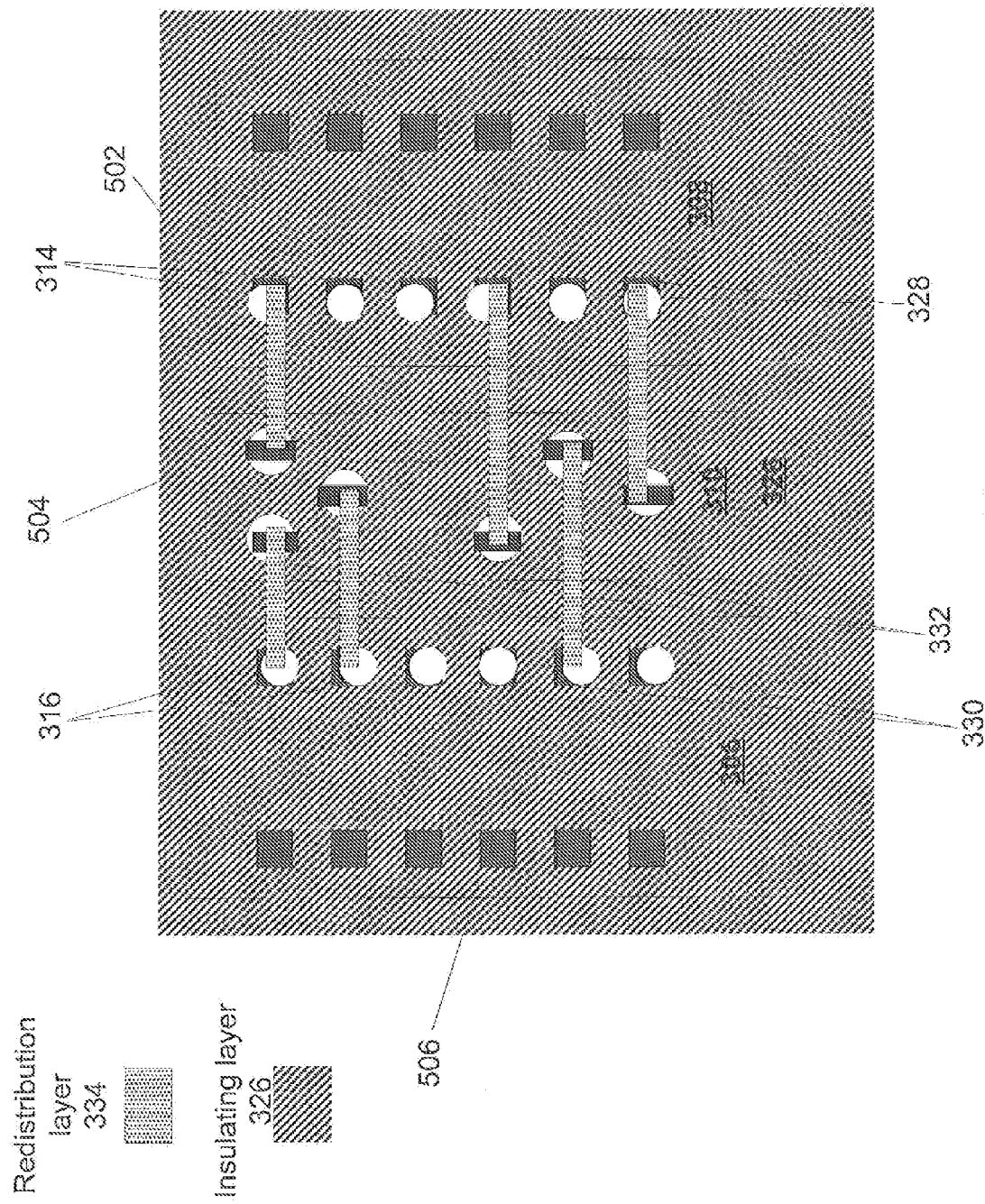
FIG. 5 is an illustration of the formation of the at least one connecting line in accordance with one embodiment of the present disclosure.

Referring to FIG. 5, an alternative illustration of the formation of the at least one connecting line is depicted in accordance with one embodiment of the present disclosure. In this embodiment, a semiconductor package, such as semiconductor package 100, is shown.

As discussed above in FIG. 3E, a redistribution layer 334 is formed over the insulating layer 326 to provide at least one connecting line 114. In this example, a first connecting line 502 is formed in the redistribution layer 334 connecting the contact element 314 of semiconductor chip 308 to routing line 504 of the embedded routing plane 310. A second connecting line 506 is formed in the redistribution layer 334 connecting the contact element 316 of semiconductor chip 306 to the routing line 504 of the embedded routing plane 310. In this way, electrical connections may be established between semiconductor chips 306 and 308 and the embedding routing plane 310 without additional redistribution layers. Crossings of electrical connections between the two semiconductor chips 306, 308 or in the routing from contact elements 314, 316 to the external contact elements may be realized locally without application of additional redistribution layers.

Figure 6:
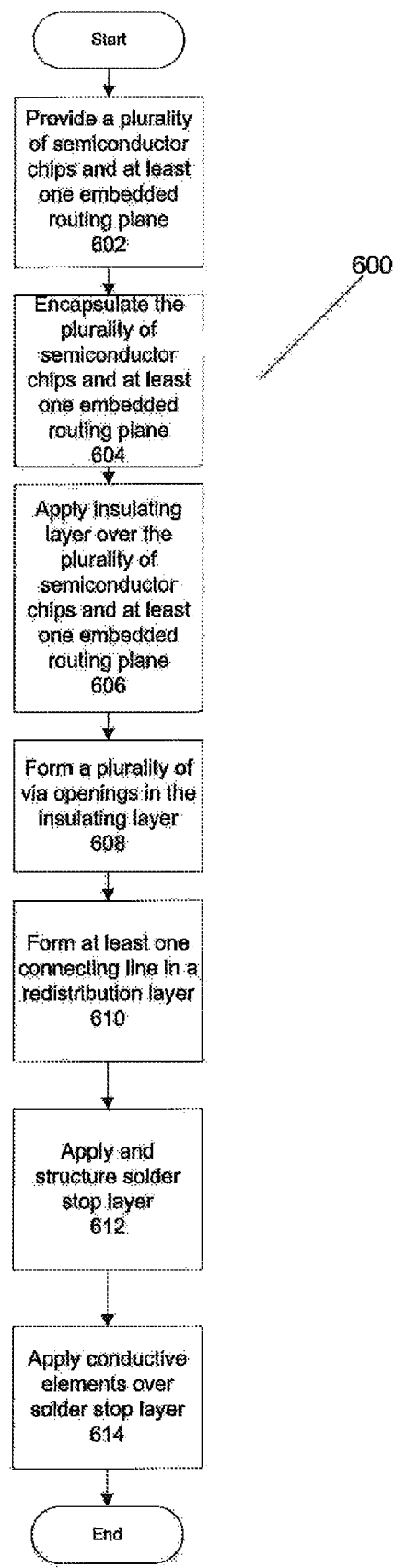
FIG. 6 is a flowchart of an exemplary process for routing electrical connections of a plurality of semiconductor chips in accordance with one embodiment of the present disclosure.

Referring to FIG. 6, a flowchart of an exemplary process is depicted in accordance with one embodiment of the present disclosure. Process 600 begins at step 602 to provide a plurality of semiconductor chips and at least one embedded routing plane. For example, semiconductor chips 306 and 308 and at least one embedded routing plane 310 may be provided on a carrier 302 over an adhesive layer 304.

Process 600 then proceeds to step 604 to encapsulate the plurality of semiconductor chips and at least one embedded routing plane. For example, a molding 320 may be formed over semiconductor chips 306 and 308 and at least one embedded routing plane 310 for encapsulation.

Process 600 then continues to step 606 to apply an insulating layer over the plurality of semiconductor chips and at least one embedded routing plane. For example, a dielectric material may be used to apply an insulating layer 326 over semiconductor chips 306 and 308 and an embedded routing plane 310.

Process 600 then continues to step 608 to form a plurality of via openings in the insulating layer. For example, via openings 328 and 330 may be formed to provide through connections to contact elements, such as contact elements 314 and/or contact elements 316 of the semiconductor chips 306, 308, respectively. In addition, via openings 332 may be formed to provide through connections to at least one routing line 312 of the at least one embedded routing plane 310.

Process 600 then continues to step 610 to form at least one connecting line in a redistribution layer. For example, at least one connecting line 114 are formed in a redistribution layer 334 electrically coupling the contact elements, such as contact elements 314 and/or the contact elements 316 of semiconductor chips 306, 308, to the at least one routing line 312 of the embedded routing plane 310. In this way, electrical connections between semiconductor chips 306 and 308 may be established with the at least one embedding routing plane 310 without additional redistribution layers.

Process 600 then continues to step 612 to apply and structure an insulating or solder stop layer over the insulating layer formed in step 606. For example, insulating or solder stop layer 336 may be formed over insulating layer 326 and structured to provide landing pads as illustrated in FIG. 3F.

Process 600 then completes at step 614 to apply conductive elements over the solder stop layer and connect to the at least one connecting line. For example, solder elements 338 may be applied over the solder stop layer 336 and connected to the at least one connecting line 114 to provide external connections to contact elements, such as the contact elements 314, 316 of semiconductor chips 306, 308, through the plurality of via openings 328 and 330.

Figure 7:
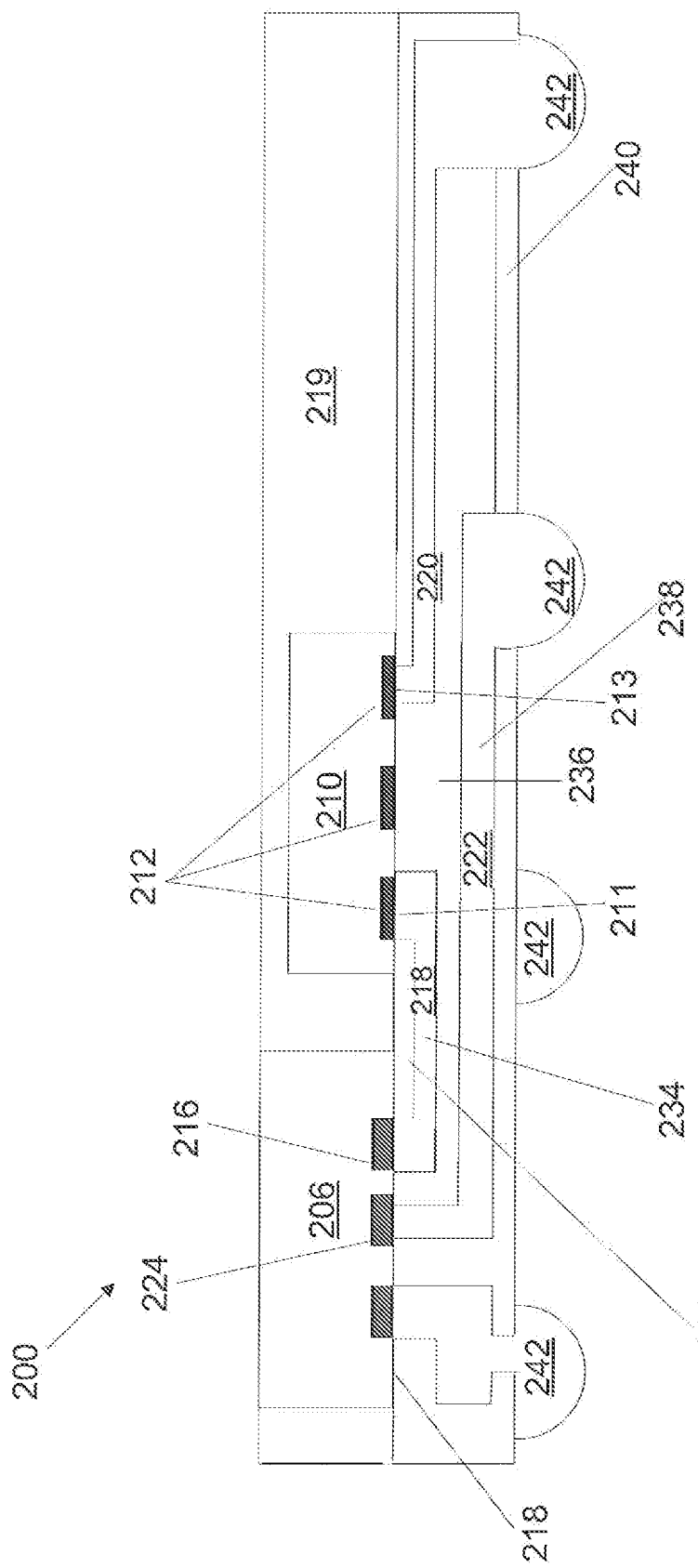
FIG. 7 is a diagram illustrates a system for routing electrical connections between semiconductor chips and external components in accordance with one embodiment of the present disclosure.

FIG. 7 illustrates a system for routing electrical connections between semiconductor chips and external components. In this embodiment, package 200 comprises semiconductor chips 206 and an embedded routing plane 210. At least one connecting line 218, 220 are provided to route electrical connections between semiconductor chip 206 and external component outside of package 200. In this example, contact elements 216 of semiconductor chip 206 is electrically coupled to at least routing line 212 of embedded routing plane 210 through via opening 211 while contact element 214 is electrically coupled to at least one routing line 212 of embedded routing plane 210 through via opening 213

The at least one connecting line 218 and 220 may be formed by applying an insulating layer 226 on the first surface 218 of the at least one semiconductor chip 206, at least one routing line 212 of the at least one embedded routing plane 210, and the molding 219. A plurality of via openings, such as via openings 211, 213, may be formed in the insulating layer 226 to provide through connections to the contact element 216 of semiconductor chip 206 and at least one routing line 212 of embedded routing plane 210. A redistribution layer 234 may be formed over the insulating layer 226 to provide at least one connecting line 218, 220.

As discussed above in FIG. 2, at least one crossing line may be formed above, below, or around the embedded routing plane to provide electrical connections between a plurality of semiconductor chips or between semiconductor chips to external component outside of package. In this embodiment, crossing line 222 is provided and electrically coupled between the semiconductor chip 206 and solder ball 242 which may be connected to external component outside of package 200. The crossing line 222 may be formed by applying an additional insulating layer 236 over the redistribution layer 234 in which the at least one connecting line 218, 220 are formed. An additional redistribution layer 238 may then be applied and structured over the additional insulating layer 236 to provide the crossing line 222 between contact element 224 of the semiconductor chip 206 and solder ball 242 connected to external component outside of package 200. With embedded routing plane 210 and crossing line 222, electrical connections may be routed between semiconductor chip 206 and external component outside of package 200. In this way, routing density in certain areas of the semiconductor package 200 may be reduced without the need for additional redistribution layers.

Figure 8:
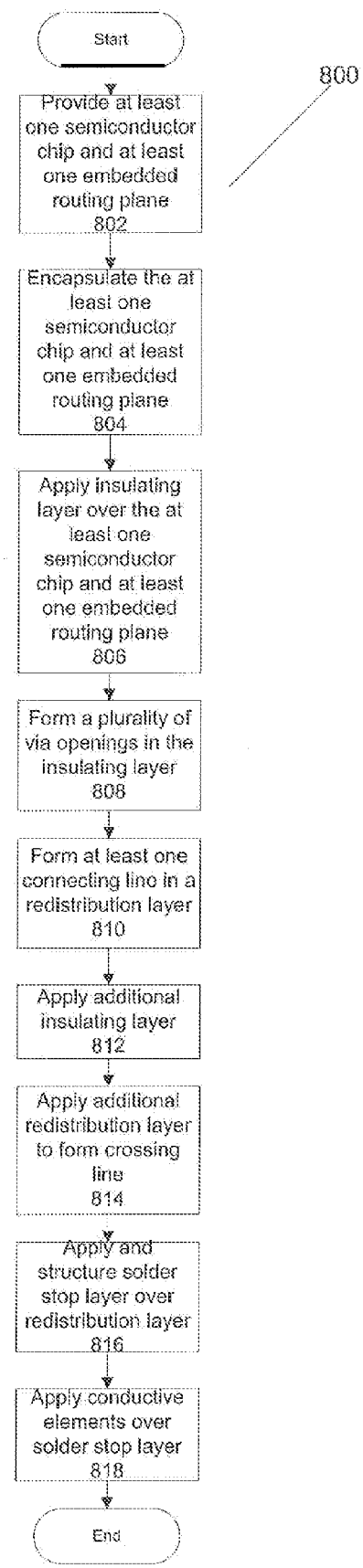
FIG. 8 is a flowchart of an exemplary process for routing electrical connections of semiconductor chips in accordance with an alternative embodiment of the present disclosure.

Referring to FIG. 8, a flowchart of an exemplary process for routing electrical connections of semiconductor chips is depicted in accordance with an alternative embodiment of the present disclosure.

Process 800 begins at step 802 to provide at least one semiconductor chip and at least one embedded routing plane in a semiconductor package, for example, semiconductor chip 206 and embedded routing plane 210 are provided in package 200 in FIG. 7. Process 800 then continues to step 804 to encapsulate the at least one semiconductor chip and at least one embedded routing plane in a semiconductor package. Encapsulation may be performed using an encapsulating material, such as a molding material.

Process 800 then continues to step 806 to apply an insulating layer over the encapsulated at least one semiconductor chip and at least one embedded routing plane. For example, insulating layer 226 may be applied over semiconductor chip 206, and embedded routing plane 210. Process 800 then continues to step 808 to form a plurality of via openings in the insulating layer. For example, via openings 211 and 213 may be formed in insulating layer 226 to provide through connections to contact element 214, 216 of semiconductor chips 206, 208.

Process 800 then continues to step 810 to form at least one connecting line in a redistribution layer. For example, at least one connecting line 218, 220 is formed in redistribution layer 234 connecting the contact element 216 of semiconductor chip 206 and at least one routing line 212 of embedded routing plane 210. Process 800 then continues to step 812 to apply an additional insulating layer. For example, additional insulating layer 236 is applied over redistribution layer 234. Then process 800 continues to step 814 to apply an additional redistribution layer over the additional insulating layer to form at least one crossing line. For example, additional redistribution layer 238 is applied over additional insulating layer 236 to form at least one crossing line 222.

Process 800 then continues to step 816 to apply and structure a solder stop layer over the redistribution layer and/or additional redistribution layer. For example, solder stop layer 240 may be applied over the redistribution layer and/or additional redistribution layer and structured to provide landing pads for conductive elements, such as solder ball 242, in FIG. 7. The solder stop layer defines positions of the conductive elements. Process 800 then completes at step 818 to apply conductive elements over the solder stop layer. For example, solder balls 242 are applied over solder stop layer 240 to provide external connections to the package 200.

Referring to FIG. 9, a diagram illustrating various embedded routing planes is depicted in accordance with alternative embodiments of the present disclosure. As shown in FIG. 9, embedded routing planes 902 and 906 may be disposed in high routing density area of semiconductor package, such as package 100 and 200 in FIGS. 1 and 2, to reduce routing density between the semiconductor chips or between the semiconductor chips and external components. In this example, embedded routing plane 902 has an L-shape which enables electrical connections to be routed from one side of the package to another through at least one routing line 904. Similarly, embedded routing plane 906 has an irregular shape, which enables electrical connections to be routed around other components in the package, for example, around semiconductor chips within the package, through at least one routing line 908.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a first semiconductor chip;
a routing plane comprising a plurality of substantially parallel spaced apart conductive routing lines;
an insulating layer disposed on the first semiconductor chip and the routing plane; and
a redistribution layer disposed over the insulating layer and including:
a first connecting line electrically coupled to the first semiconductor chip and one of the plurality of substantially parallel spaced apart conductive routing lines; and
a second connecting line electrically coupled to the one of the plurality of substantially parallel spaced apart conductive routing lines and to one of a second semiconductor chip and a first external contact element.

2. The device of claim 1, wherein the first semiconductor chip and the routing plane are encapsulated by an encapsulating material.

3. The device of claim 1, wherein the first connecting line is electrically coupled to the one of the plurality of substantially parallel spaced apart conductive routing lines and to the first semiconductor chip through a plurality of via openings in the insulating layer.

4. The device of claim 3, wherein the plurality of via openings in the insulating layer are formed at any location along the one of the plurality of substantially parallel spaced apart conductive routing lines.

5. The device of claim 1, wherein the routing plane includes at least one of a silicon substrate, a polymer substrate, a ceramic substrate, or a metal substrate.

6. The device of claim 1, wherein the one of the plurality of substantially parallel spaced apart conductive routing lines is coplanar with an active side of the first semiconductor chip.

7. The device of claim 1, further comprising:
a crossing line that is disposed over the insulating layer and completely insulated from the routing plane by the insulating layer, wherein the crossing line crosses the routing plane and is electrically coupled to the first semiconductor chip and a second external contact element.

8. The device of claim 7, wherein the crossing line is formed in the redistribution layer.

9. A semiconductor device comprising:
at least one semiconductor chip embedded in a molding and having at least one contact element;
at least one routing plane embedded in the molding and having at least one routing line that is coplanar with the at least one contact element;
a first insulating layer disposed on the at least one contact element and the at least one routing line; and
a redistribution layer disposed over the first insulating layer to form a first connecting line and a second connecting line, wherein the first connecting line is electrically coupled to a first semiconductor chip of the at least one semiconductor chip and to a routing line of the at least one routing line and the second connecting line is electrically coupled to the routing line and one of a second semiconductor chip of the at least one semiconductor chip and a first external contact element.

10. The device of claim 9, wherein the at least one routing plane is disposed between the first semiconductor chip and the second semiconductor chip.

11. The device of claim 9, further comprising:
a plurality of via openings formed in the first insulating layer and structured over the at least one contact element and the at least one routing line.

12. The device of claim 11, wherein the first connecting line is electrically coupled to the at least one contact element and the routing line through the plurality of via openings.

13. The device of claim 11, wherein the second connecting line is electrically coupled to the first external contact element and the routing line through the plurality of via openings.

14. The device of claim 9, further comprising:
a second insulating layer disposed over the redistribution layer.

15. The device of claim 14, further comprising:
at least one conductive element disposed over the second insulating layer.

16. The device of claim 14, further comprising:
a second redistribution layer disposed over the second insulating layer to form at least one crossing line.

17. The device of claim 16, wherein the at least one crossing line is electrically coupled to the at least one contact element of the at least one semiconductor chip and a second external contact element.

18. A method for routing electrical connections comprising:
- providing a first semiconductor chip and a routing plane including a plurality of substantially parallel spaced apart conductive routing lines;
- applying a first insulating layer on the first semiconductor chip and the routing plane;
- forming a plurality of via openings in the first insulating layer; and
- forming a first redistribution layer over the first insulating layer to provide a first connecting line electrically coupled to the first semiconductor chip and to one of the plurality of substantially parallel spaced apart conductive routing lines and a second connecting line electrically coupled to the one of the plurality of substantially parallel spaced apart conductive routing lines and to one of a second semiconductor chip and a first external contact element.

19. The method of claim 18, wherein providing the first semiconductor chip and the routing plane comprises:
- providing at least one contact element in the first semiconductor chip; and
- providing at least one routing line in the routing plane.

20. The method of claim 18, wherein forming a plurality of via openings in the first insulating layer comprises:
- forming a plurality of via openings over the at least one contact element and the at least one routing line.

21. The method of claim 18, further comprising:
- encapsulating the first semiconductor chip and the routing plane with an encapsulating material.

22. The method of claim 18, further comprising:
- applying a solder stop layer over the first redistribution layer; and
- structuring the solder stop layer to apply at least one conductive element.

23. The method of claim 18, further comprising:
- applying a second insulating layer over the first redistribution layer; and
- applying a second redistribution layer over the second insulating layer to form at least one crossing line.

24. The method of claim 23, further comprising:
- applying a solder stop layer over the second redistribution layer; and
- structuring the solder stop layer to apply at least one conductive element.

* * * * *